United States Patent
Jang et al.

(10) Patent No.: US 6,903,348 B2
(45) Date of Patent: Jun. 7, 2005

(54) WAFER HOLDING APPARATUS FOR ION IMPLANTING SYSTEM

(75) Inventors: Tae-Ho Jang, Kyunggi-do (KR); Jong-Oh Lee, Kyunggi-do (KR)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

(21) Appl. No.: 10/302,664

(22) Filed: Nov. 21, 2002

(65) Prior Publication Data

US 2003/0094583 A1 May 22, 2003

(30) Foreign Application Priority Data

Nov. 22, 2001 (KR) .......................................... 2001-72962

(51) Int. Cl.$^7$ .................................................. H01J 37/304
(52) U.S. Cl. .............................. 250/492.21; 250/491.1; 250/492.1; 250/492.2; 250/492.22; 250/492.23; 250/492.24; 250/492.3; 250/311; 250/398; 250/441.11; 250/442.11
(58) Field of Search ...................... 250/492.21, 491.1, 250/492.1–492.3, 311, 398, 441.11, 442.11

(56) References Cited

U.S. PATENT DOCUMENTS

| | | | |
|---|---|---|---|
| 4,672,210 A | | 6/1987 | Armstrong et al. |
| 4,733,091 A | * | 3/1988 | Robinson et al. ......... 250/492.2 |
| 5,898,179 A | * | 4/1999 | Smick et al. ........... 250/492.21 |
| 6,163,033 A | * | 12/2000 | Smick et al. ........... 250/441.11 |
| 6,404,505 B2 | * | 6/2002 | Matsui ........................ 356/620 |
| 6,437,351 B1 | * | 8/2002 | Smick et al. ........... 250/492.21 |
| 2002/0003629 A1 | * | 1/2002 | Matsui ........................ 356/614 |
| 2002/0109106 A1 | * | 8/2002 | Berrian et al. ......... 250/492.21 |
| 2002/0148961 A1 | * | 10/2002 | Nakasuji et al. ............ 250/311 |
| 2003/0068215 A1 | * | 4/2003 | Mori et al. .................. 414/217 |
| 2003/0094583 A1 | * | 5/2003 | Jang et al. ............. 250/492.21 |
| 2003/0133125 A1 | * | 7/2003 | Hattori ........................ 356/500 |

* cited by examiner

*Primary Examiner*—John R. Lee
*Assistant Examiner*—Bernard E. Souw
(74) *Attorney, Agent, or Firm*—Marger Johnson & McCollom, P.C.

(57) ABSTRACT

An ion implanting system and a wafer holding apparatus therefor are provided. The ion implanting system includes x- and y-axis rotating parts; first and second angle measuring circuits; and a controller. The x-axis rotating part rotates a main surface of a wafer about an x-axis, and the y-axis rotating part rotates the main surface of the wafer about a y-axis. The first angle measuring circuit is rotated along with the main surface of the wafer and measures a tilt angle of the main surface of the wafer with respect to the x-axis. The second angle measuring means is rotated along with the main surface of the wafer and measures a rotating angle of the main surface of the wafer with respect to the y-axis. The controlling part, when the measured tilt angles are different from target tilt angles, controls the x- and y-axis rotating parts such that the measured tilt angles are equal to the target tilt angles. In the present invention, the ion implanting system and the wafer holding apparatus therefor can measure and monitor an incidence angle of an ion beam with respect to a tilted wafer.

38 Claims, 12 Drawing Sheets

WAFER HOLDING APPARATUS FOR ION IMPLANTING SYSTEM

RELATED APPLICATION

This application claims priority from Korean Patent Application No. 2001-72962, filed on Nov. 22, 2001, the contents of which are herein incorporated by reference in their entirety.

TECHNICAL FIELD

This disclosure is directed to an ion implanting system and, more specifically, to an ion implanting system and a wafer holding apparatus therefor that can measure and monitor an incidence angle of an ion beam with respect to a tilted wafer.

BACKGROUND

In the whole semiconductor fabrication process, an ion implantation is a physical step in which impurity ions are implanted into a wafer in order to provide the wafer with modified electrical characteristics from its natural state. In other words, the technique is used to select and accelerate impurity ions of a certain species and of a certain quantity so as to implant the impurity ions into a particular portion of the wafer to a needed depth. As compared to a thermal diffusion, the ion implantation can markedly reduce diffusion of the impurity ions into sides of an impurity region. In addition, it is possible to undergo the process at a lower temperature than if diffusion were used, so that the impurity region can be minutely formed without degrading a photoresist. Accordingly, while overcoming disadvantages of the thermal diffusion, the ion implantation has been extensively used for the semiconductor fabrication processes.

Each of ion implanting systems is configured with an ion generator; a beam line; and an end station, and their construction diagrams are generally almost the same. The detailed description of this is found in U.S. Pat. No. 4,672,210. According to process conditions, the ion implanting systems can typically be categorized as mid-current ion implanting systems, high-current ion implanting systems, or high-energy ion implanting systems. Their constructions may be a little different depending on manufacturers and models.

The ion implanting system enables selecting and accelerating of ions of a needed quantity required for forming layers, thereby implanting the ions into the wafer. At this time, the wafer is positioned on a wafer holding apparatus.

Figure 8:
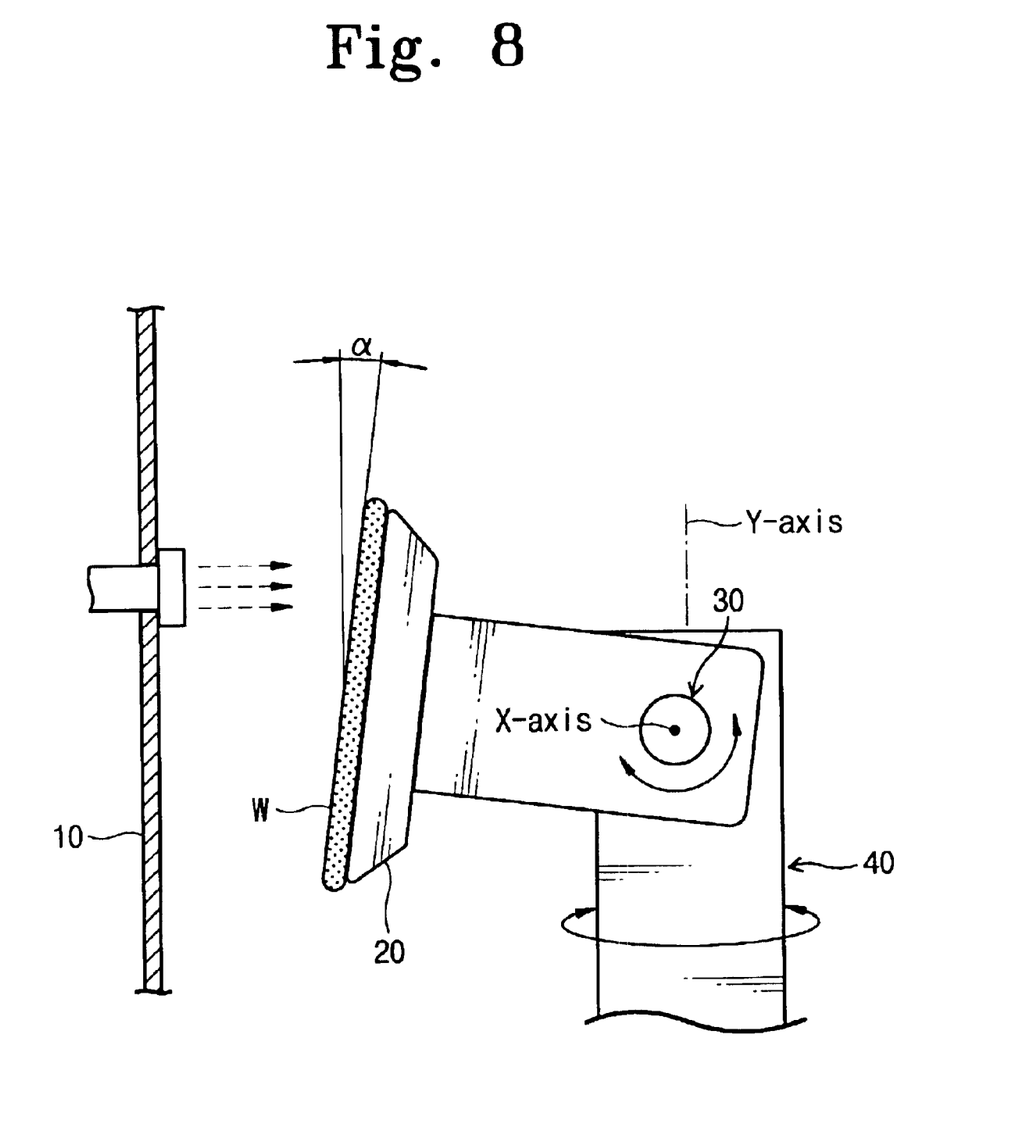
FIG. 8 illustrates problems that arise when a wafer is mounted on an end station of a conventional ion implanting system.

FIG. 8 illustrates problems that may arise when the wafer is mounted on an end station of a conventional ion implanting system.

A reference numeral "w" denotes a wafer where semiconductor elements are fabricated; a reference numeral "10" denotes one sidewall of an ion implanting chamber; a reference numeral "20" denotes an electro static chuck (ESC); and reference numerals "30" and "40" denote an x-axis rotating part for controlling a tilt angle of the ESC with respect to an x-axis and a y-axis rotating part for controlling a tilt angle of the ESC with respect to a y-axis, respectively. For example, the tilt angle of the wafer w with respect to an ion beam is preferably adjusted to be about 7 degree when the ion beam is projected against the wafer.

The tilt angle of the ESC 20 illustrated in FIG. 8 is determined by encoding movements of motors when the motors (not shown) included in the x- and y-axis rotating parts 30 and 40 are driven on the basis of a hard stop. According to the determined tilt angle, the position and the tilt angle of the ESC 20 are set. In case the position of the hard stop is swerved due to errors of the apparatus, the initial position of the ESC 20 may be mistakenly set. Thus, in the ion implantation process, the ESC 20 tilted toward one side may be recognized as an initialized condition, thus disabling ion implantation into a predetermined position of the wafer 10. Consequently, the semiconductor devices cannot obtain characteristics as required.

As mentioned above, the conventional wafer holding apparatus has been dependant upon a mechanical alignment without any sensing system for maintaining and managing the angle of the ESC 20. Thus, it was impossible to sense and compensate positional deviation that could arise after employing the apparatus for a long time.

Besides, the conventional wafer holding apparatus for the ion implanting system reads an encode value of the motor and feedbacks the tilt angle to an operation interface so as to compensate the tilt angle. However, since the conventional apparatus reads the encode value of the motor as a tilt angle of a surface of the ESC 20, the substantial tilt angle of the ion beam with respect to a surface of the wafer can be changed not only by a mechanical structure, for example, a connection structure like an axis of rotation, but also by deviation of the incidence angle of the ion beam. Therefore, it cannot be seen that the conventional wafer holding apparatus substantially feedbacks the tilt angle to the operation interface.

SUMMARY OF THE INVENTION

Embodiments of the present invention are directed to providing an ion implanting system and a wafer holding apparatus therefor, which can sense a substantial tilt angle of an ion beam with respect to a main surface of a wafer mounted on the wafer holding apparatus, thereby preventing deterioration caused by deviation of an incidence angle of the ion beam.

BRIEF DESCRIPTION OF THE DRAWINGS

Additional features and advantages of the present invention will be more readily apparent from the following detailed description of preferred embodiments thereof when taken together with the accompanying drawings in which.

DESCRIPTION OF THE PREFERRED EMBODIMENT

The present invention will now be described more fully hereinafter with reference to the accompanying drawings, in which preferred embodiments of the invention are shown. This invention may, however, be embodied in different forms and should not be constructed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout the specification.

Figure 1:
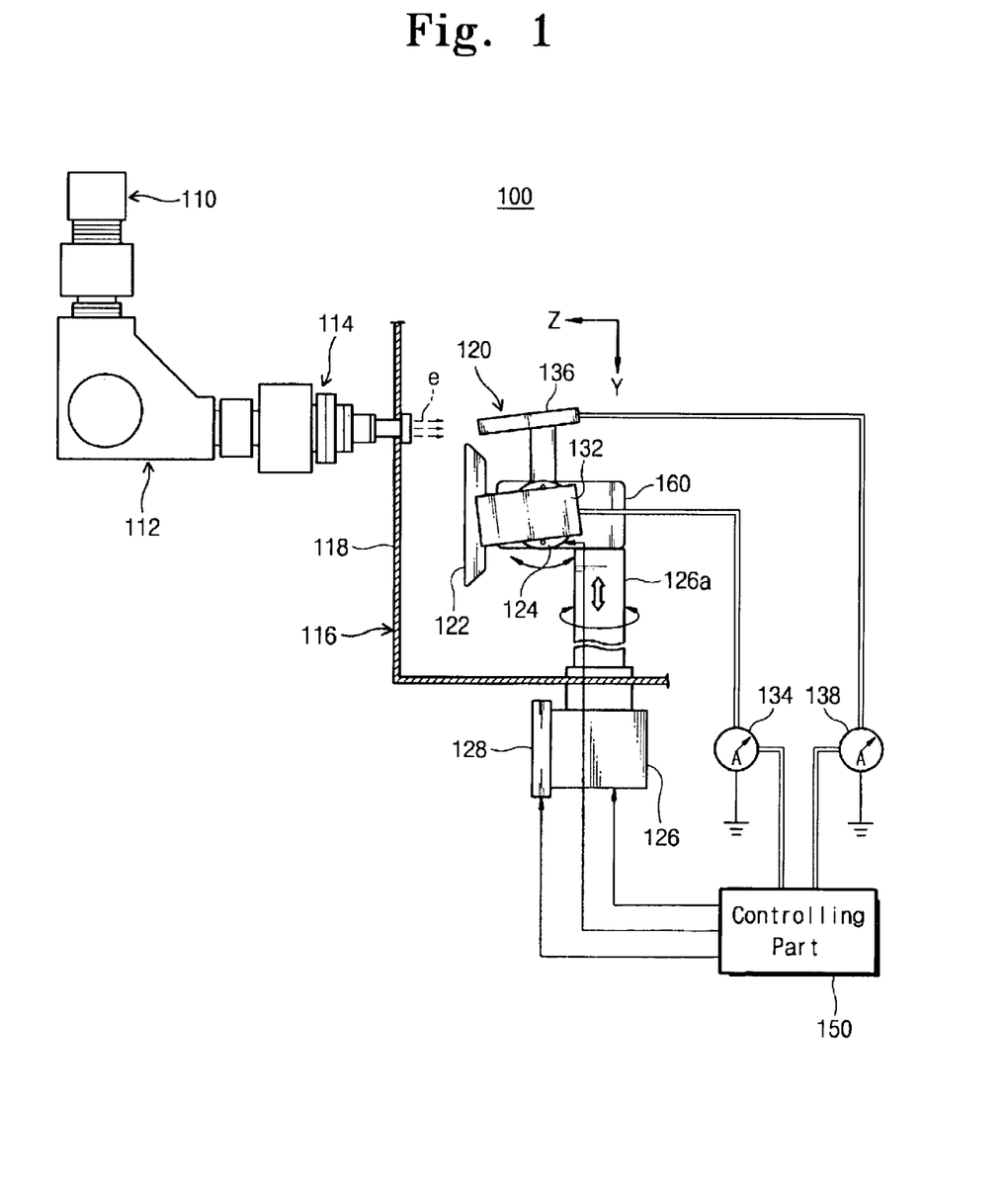
FIG. 1 illustrates a construction diagram of an ion implanting system according to an embodiment of the invention.

An ion implanting system 100 illustrated in FIG. 1 is an apparatus for ionizing impurities, accelerating the ionized impurities and emitting the resulting impurities to portions of a wafer not otherwise covered by a mask, thereby implanting a desired amount of the impurities into a desired region of the wafer.

Referring to FIG. 1, the ion implanting system 100 according to embodiments of the present invention includes an ion source 110; an analyzer 112; an accelerator 114; and an end station 116. The ion source 110 forms an ion beam by ionizing an ion source. The analyzer 112 separates undesired species of ions from the ion beam. The accelerator 114 accelerates the purified ion beam by an energy, for example, ranging from 2 to 200 KeV. The end station 116 includes a vacuum chamber 118 as well as a wafer holding apparatus (generally indicated as 120) for translational motion or scanning of a wafer w held thereby. Although not shown in the drawings, the end station 116 may also include a wafer moving apparatus for loading the wafer into the wafer holding apparatus 120, prior to an ion implantation, and for unloading the wafer from the wafer holding apparatus 120 after the ion implantation.

Figure 2:
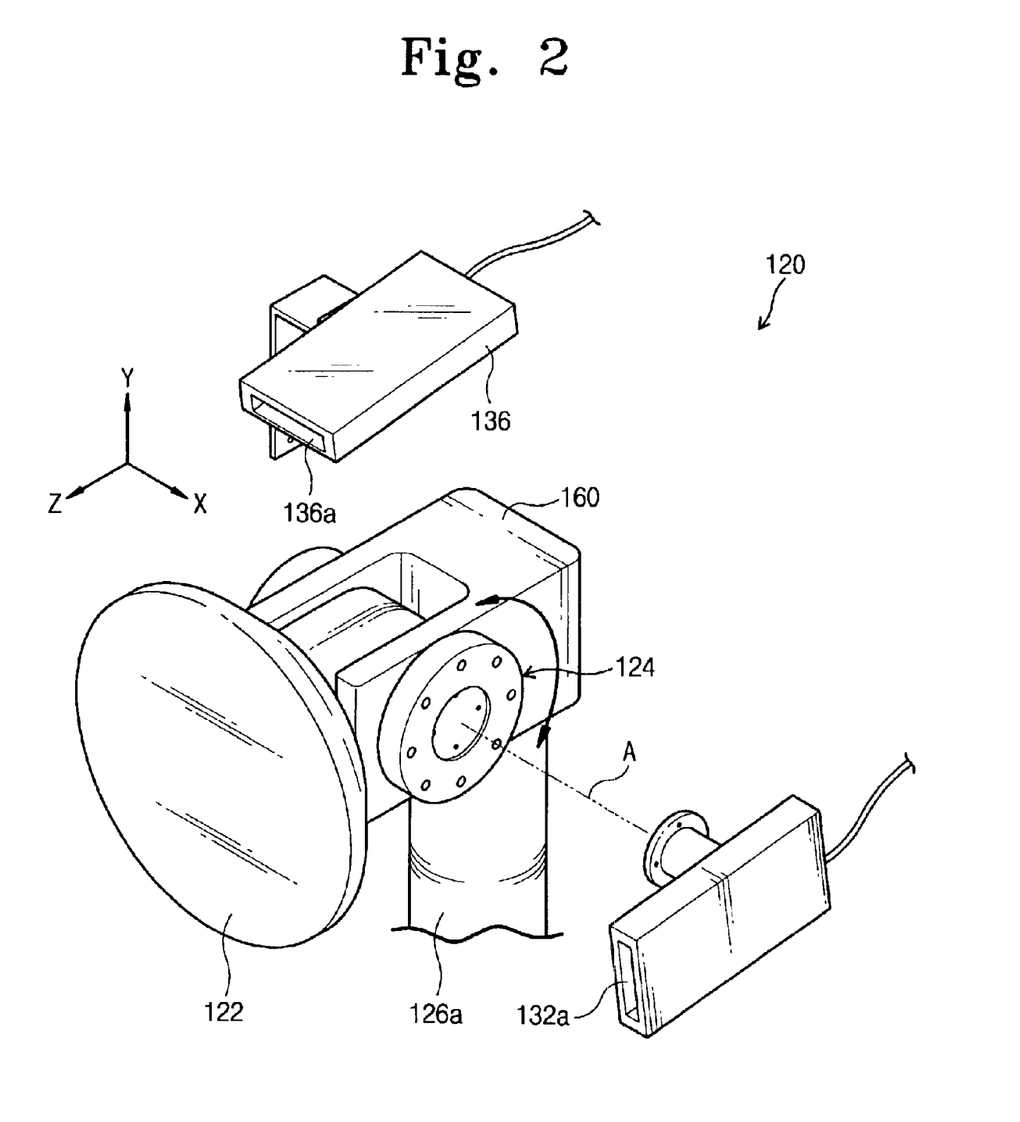
FIG. 2 illustrates a schematic diagram of a wafer holding apparatus of an end station according to embodiments of the invention.
Figure 3A:
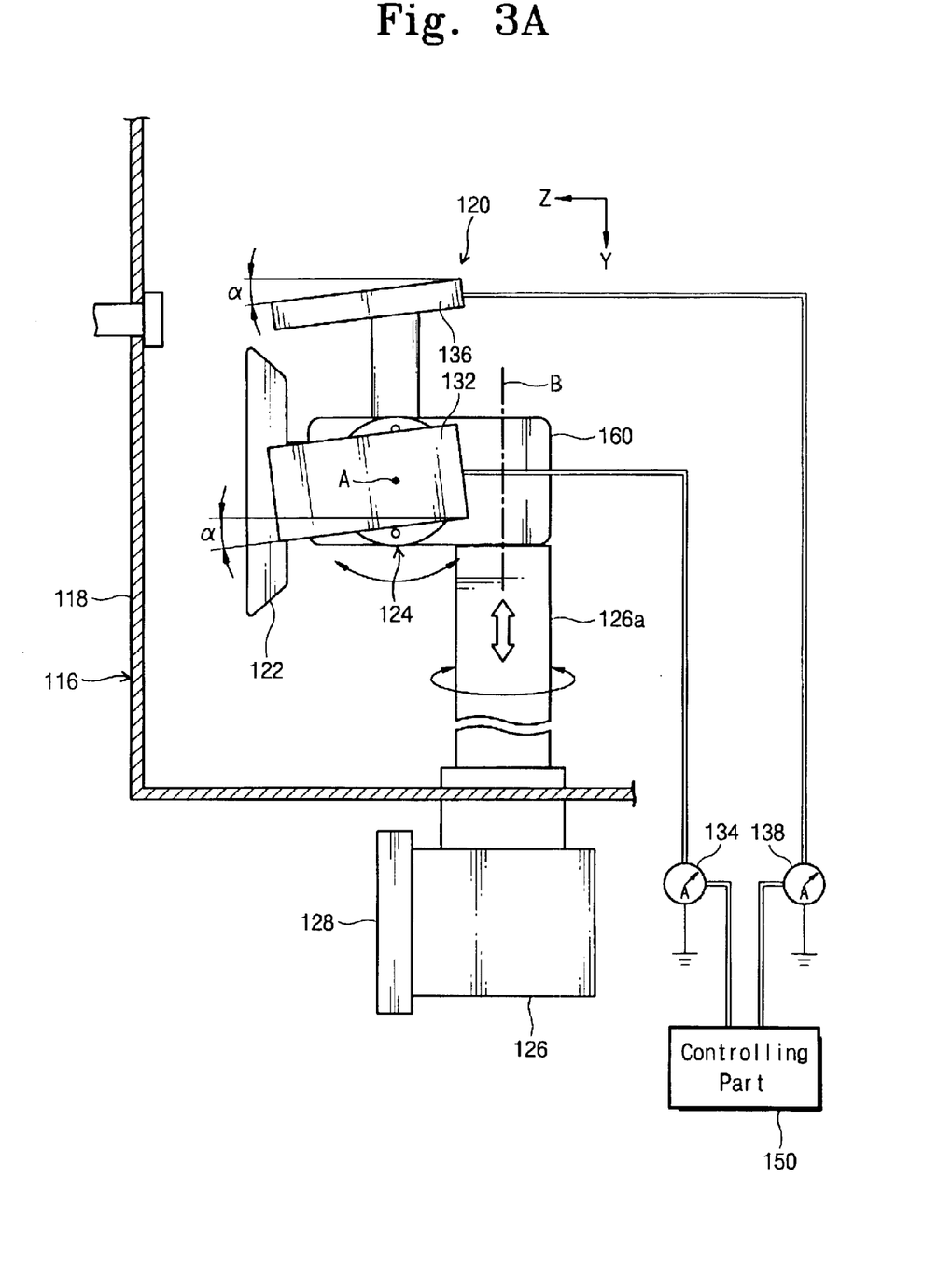
FIGS. 3A to 3C illustrate lateral, plane, and front views of the wafer holding apparatus of FIG. 1, respectively.
Figure 3B:
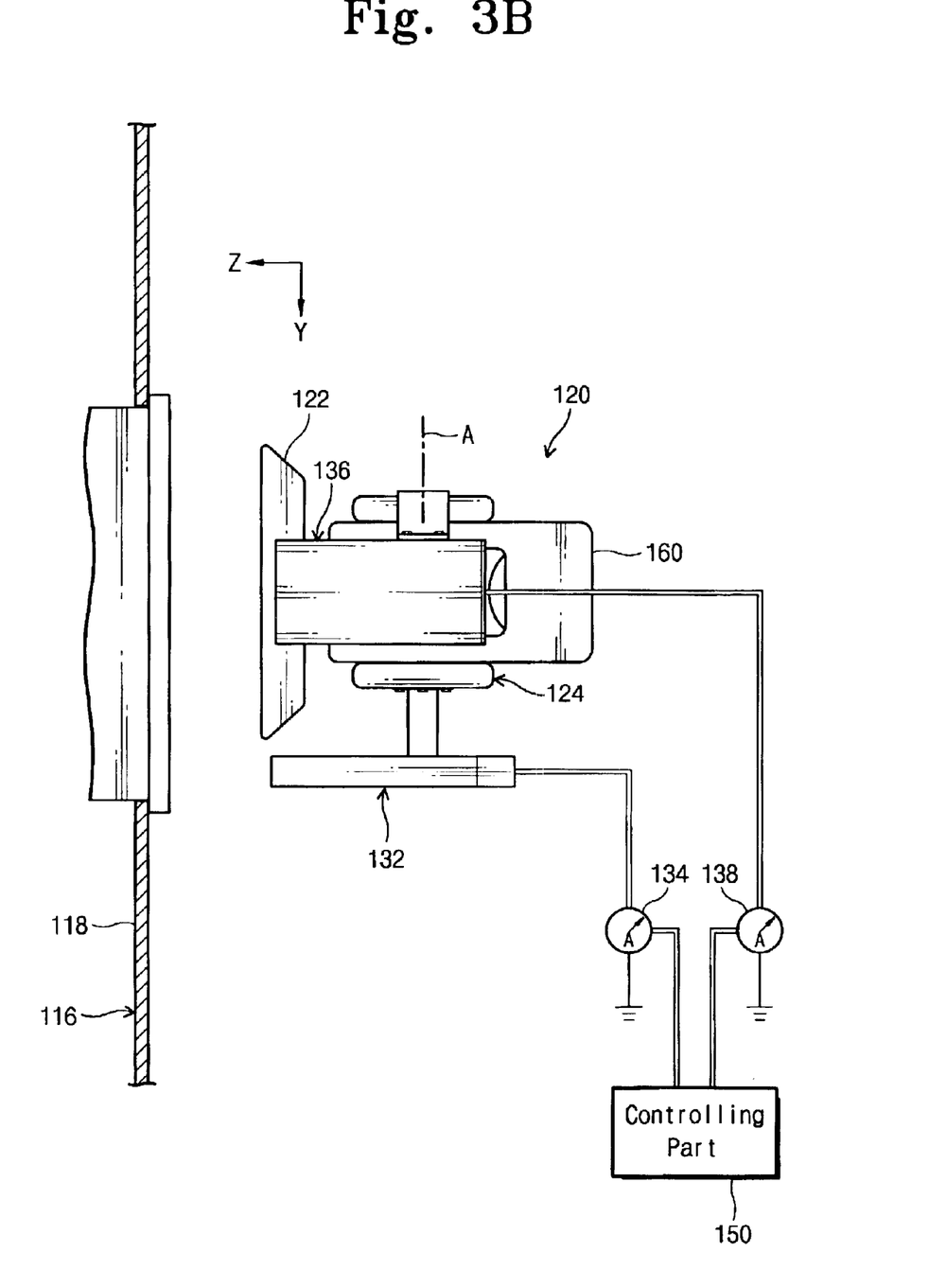
Figure 3C:
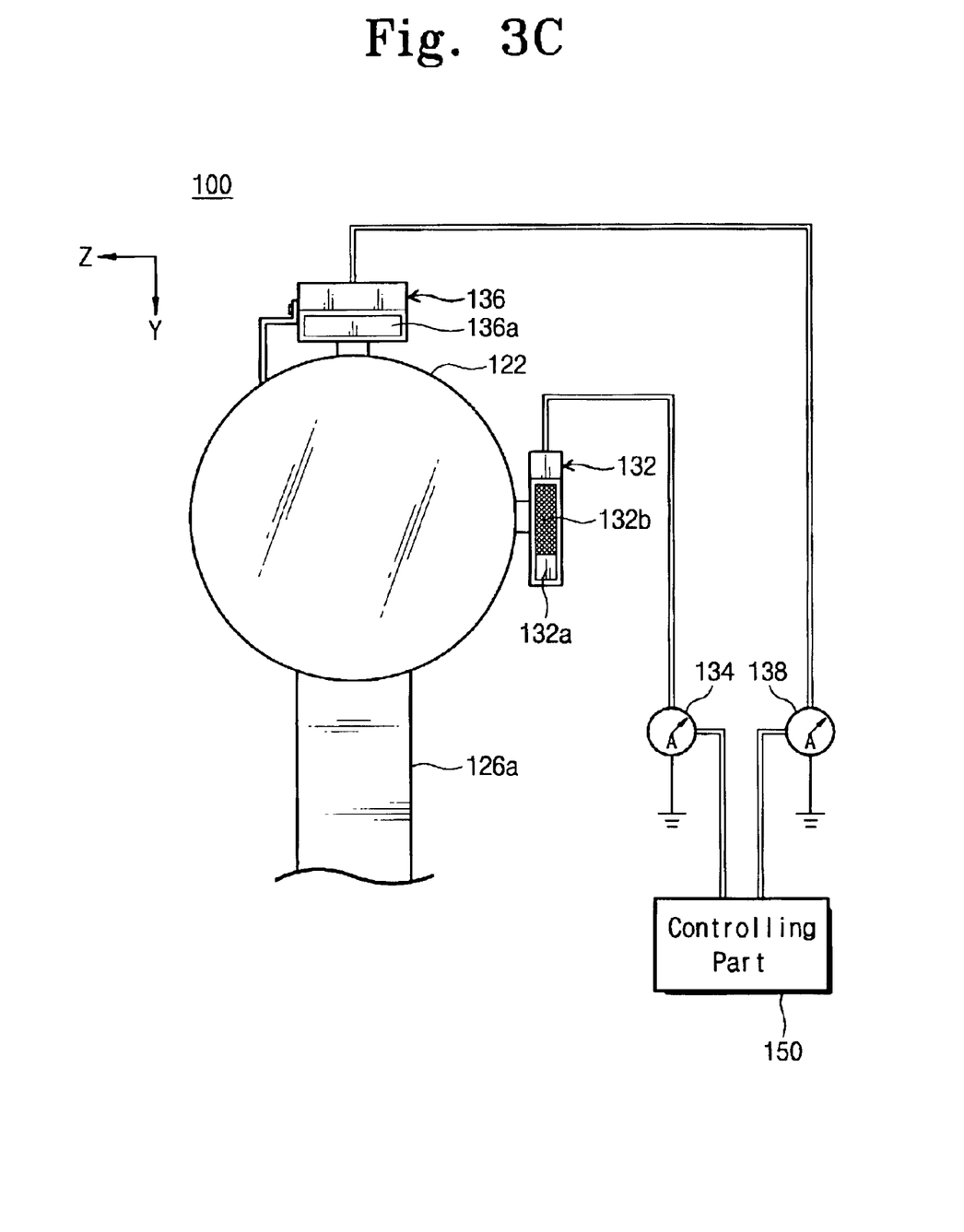

FIG. 2 illustrates a schematic diagram of the wafer holding apparatus 120 of the end station according to an embodiment of the present invention. FIGS. 3A to 3C illustrate lateral, plane, and front views of the wafer holding apparatus 120, respectively.

Referring to FIGS. 2 through 3C, the wafer holding apparatus 120 includes an electro static chuck (ESC; 122) for fixing the wafer w; a first rotating part 124; a second rotating part 126; a lift member 128; an angle measuring system (described below); and a controlling part 150.

Figure 5A:
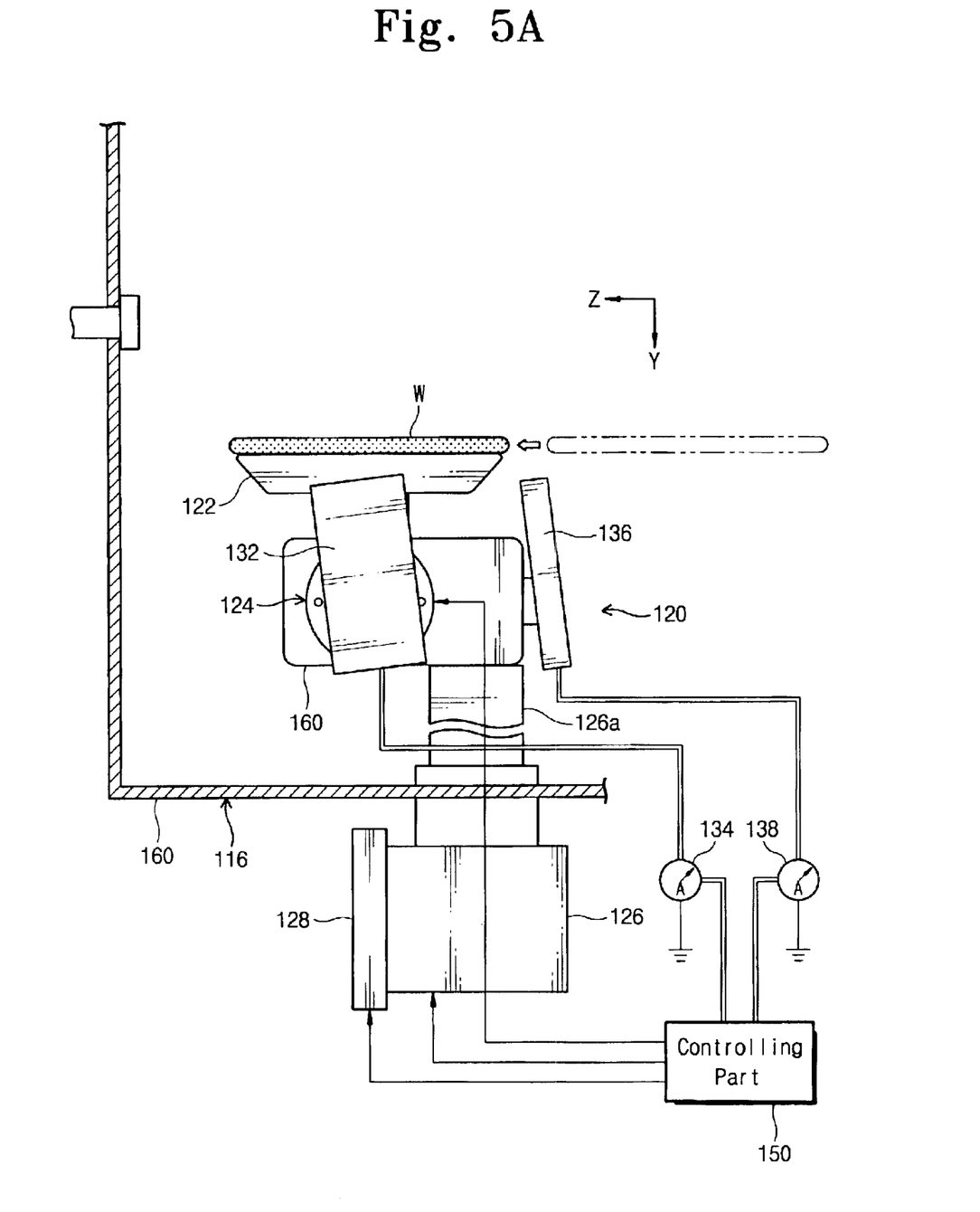
FIGS. 5A and 5B illustrate loading/unloading positions of an electro static chuck (ESC) and an implanting position of ions, respectively.
Figure 5B:
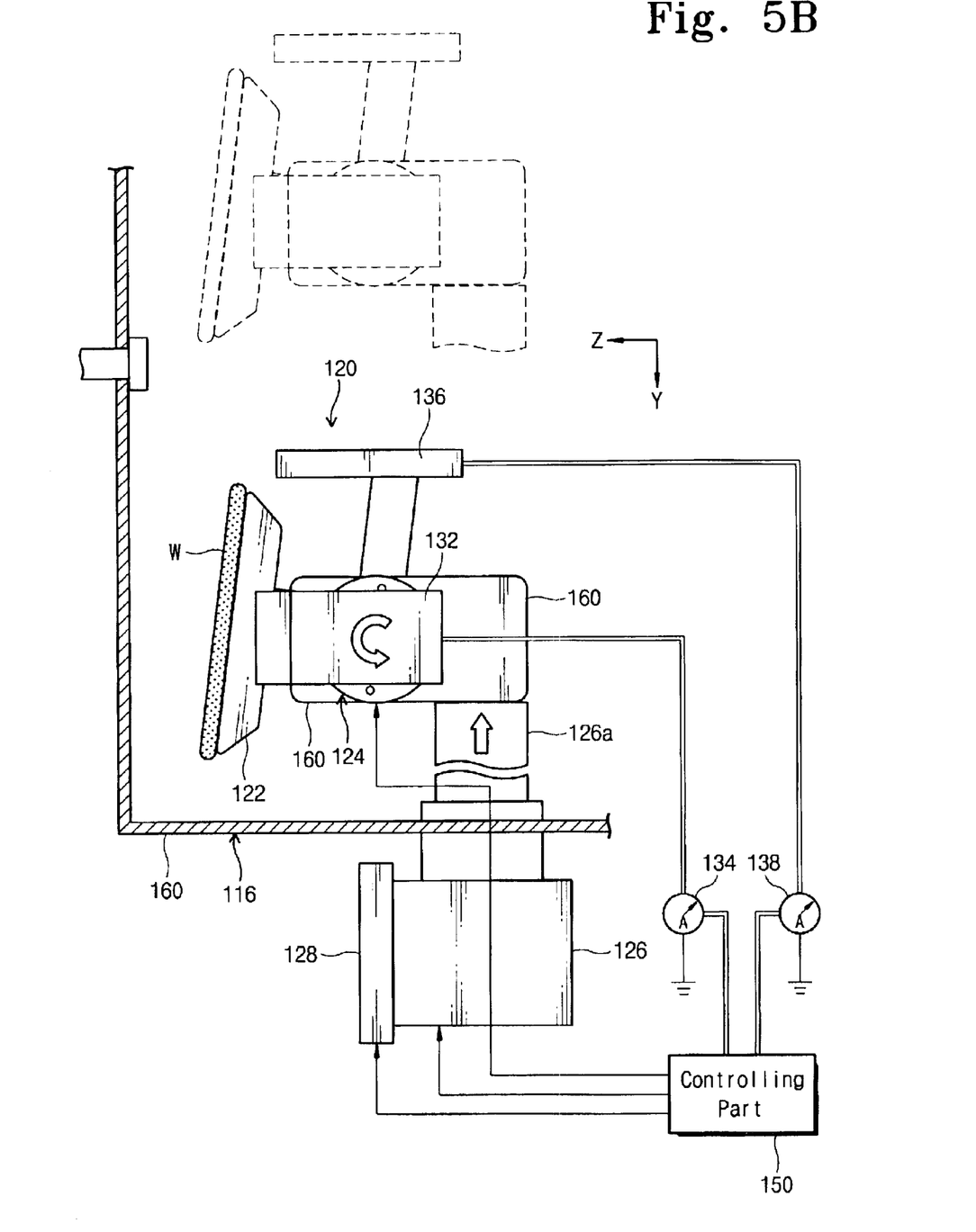

The ESC 122 is supported by the first rotating part 124, and rotated by the first rotating part 124 on an x-axis (A; an axis passing through a pivot of the first rotating part). The ESC 122 can be pivoted by the first rotating part 124 on the x-axis A between a position of ion implantation and positions of loading/unloading. Presently, the position of the ESC 122 during an ion implantation is nearly perpendicular, as illustrated in FIG. 5B, while the positions of the ESC 122 during a loading/unloading are nearly horizontal as illustrated in FIG. 5A. The first rotating part 124 is fixed to a fixed bracket 160, and the fixed bracket 160 is supported by a shaft 126a of the second rotating part 126.

In addition, the ESC 122 is rotated by the second rotating part 126 on a y-axis B. A lift member 128 is mounted on the second rotating part 126, and moves a shaft 126a of the second rotating part 126 perpendicularly along the y-axis B. Driving parts of the lift member 128 and the second rotating part 126 are positioned outside the vacuum chamber 118. The ESC 122 is moved along the y-axis by operations of the lift member 128 such that the ion beam is scanned to an entire main surface of the wafer w. The highest position of the wafer holding apparatus 120 is illustrated as dotted outlines of FIG. 5B. For example, the first and second rotating parts 124, 126 can be driven by step motors and the lift member 128 can be driven by a cylinder apparatus. Because it is well known to those skilled in the art that various techniques for driving are applicable, detailed descriptions of this will be omitted here for brevity.

Although the ESC 122 is used to fix the wafer in some embodiments of the invention, it is only one example of the present invention. In addition, a vacuum absorbing technique, a mechanical fixing technique and the like can be employed to fix the wafer.

The angle measuring system, includes a first faraday cup 132; first angle measuring means having a first current meter 134 (FIG. 3); a second faraday cup 136; and second angle measuring means having a second meter 138.

A first portion of the angle measuring system measures a tilt angle of the main surface of the wafer with respect to the x-axis A. The first faraday cup 132 includes a slot 132a (FIG. 2) formed along the y-axis B, as well as a conductive plate 132b (shown in FIG. 3c) which is a beam sensing region corresponding to the slot 132a. The first faraday cup 132 is mounted on the first rotating part 124 and positioned by the side of the ESC 122. The first current meter 134 is coupled to the first faraday cup 132, and structured to measure an amount of current provided to the conductive plate 132b, so as to control and neutralize secondary electrons generated by collision of the ion beam e with the conductive plate 132b of the first faraday cup 132.

A second portion of the angle measuring system measures a tilt angle of the main surface of the wafer w with respect to the y-axis. The second faraday cup 136 includes a slot 136a formed along the x-axis A as well as a conductive plate 136b, which is a beam sensing region corresponding to the slot 136a. The second faraday cup 136 is also mounted on the first rotating part 124 and positioned above the ESC 122. The second current meter 138 is coupled to the second faraday cup 136a, and structured to measure an amount of current provided to the conductive plate 136b, so as to control and neutralize secondary electrons generated by collision of the ion beam e with the conductive plate 136b of the second faraday cup 136.

Because the first and second faraday cups 132, 136 are mounted on the first rotating part 124, when the ESC 122 is rotated to a target tilt angle, the conductive plates 132b and 136b, which are the beam sensing regions of the first and second faraday cups 132 and 136, as well as the slots 132a and 136a should be mounted so as to be perpendicular to the ion beam e. For instance, it is preferable that an interval between the slots 132a, 136a and the conductive plate is wide enough to measure even a minute difference of angles.

Generally, in an ion implantation process, the ion beam is not perpendicularly projected against the main surface of the wafer mounted on the ESC 122. To prevent ion channeling, the ion beam is projected against the main surface of the wafer at a predetermined angle of implantation (an incidence angle; α). (The angle of implantation generally ranges from 0 to 10 degree, and typically is 7 degrees). For this reason, the ESC 122 to which the wafer is fixed is tilted by the angle of implantation α prior to the ion implantation process. Therefore, in embodiments of the invention, the first and second faraday cups 132 and 136 are mounted on the first rotating part 124 tilted from the angle of the ESC 122 by the angle of implantation (α, e.g. 7 degrees) (illustrated in FIG. 3A).

A controlling part 150 is coupled to both of the current meters 134, 138, and is structured to control the first and second rotating parts 124, 126, and the lift member 128. In particular, if a target tilt angle of the ESC 122 is different from a tilt angle measured by the angle measuring system, the controlling part 150 controls the rotating parts 124 and 126 so as to compensate the tilt angles of the x-axis and y-axis A and B of the ESC 122. More specifically, the controlling part 150 compares accumulated data (or accumulated current values) measured by the first and second meters 134 and 138 to pre-set data (or pre-set current values) and, according to the results, controls the first and second rotating parts 124 and 126.

The controlling part 150 may be formed of a microcontroller, a memory, one or more analog-to-digital converters (ADCs), and one or more digital-to-analog converters (DACs), etc. Alternatively, the controlling part 150 may be formed of a discrete electronic logic circuit (such as an Application Specific Integrated Circuit (ASIC)), corresponding to the above-described configuration.

Figure 4:
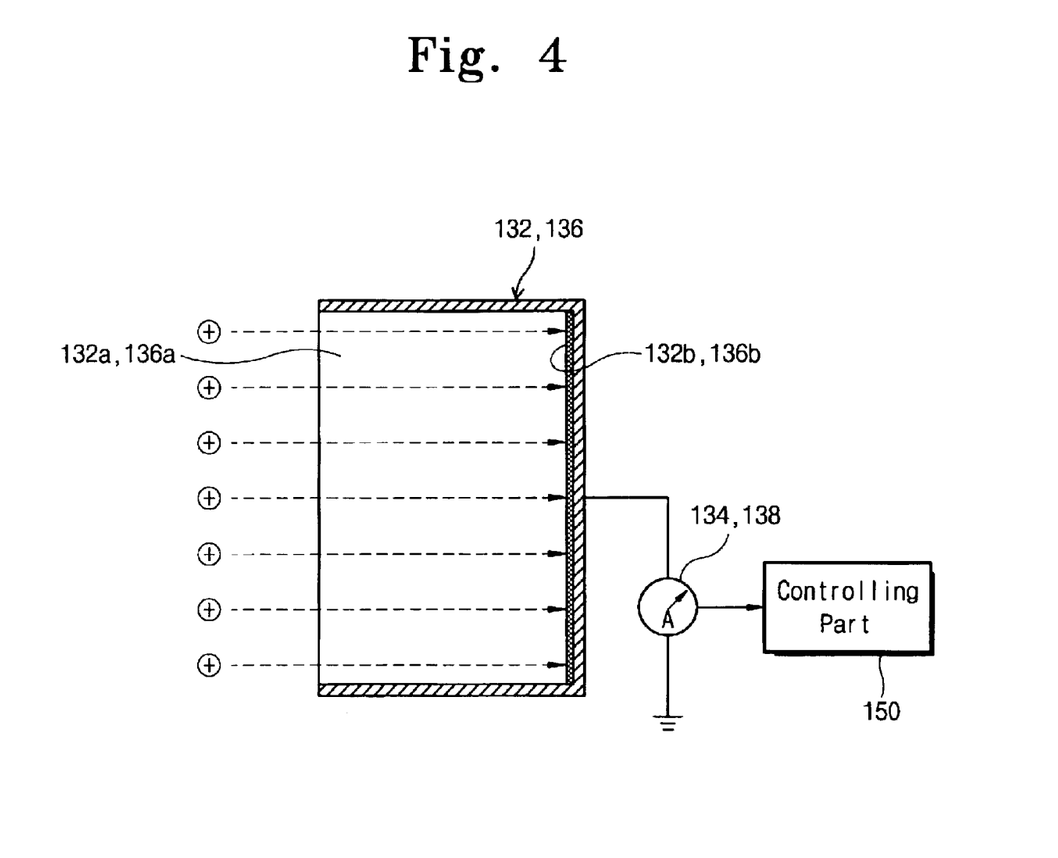
FIG. 4 illustrates an ion beam projected perpendicularly against a faraday cup.

Referring to FIG. 4, the pre-set data are indicative of the current values measured by the meters 134, 138 when the ion beam is projected against an entire region of the conductive plates (or the beam sensing regions) of the faraday cups 132 and 136. To project the ion beam against the entire region of the conductive plate, the ion beam should be projected perpendicularly against the conductive plate. For example, if the ESC 122 is not rotated by the target tilt angle, the ion beam is tilted with respect to a perpendicular angle of the conductive plate 132b or 136b of the first or second faraday cup 132 or 136. Because of this tilt, a portion of the electron beam will be blocked from the conductive plate 132b, 136b, by an edge of the faraday cup 132, 136. As a result, the accumulated current value measured by the meter 134 or 138, which corresponds to the conductive plate 132b or 136b, becomes less than the pre-set current value. The controlling part 150 can check the tilt angle of the ESC based on the foregoing correlation, by determining that the values measured by the meters 134, 138 are below the pre-set data, which indicates the maximum current that the meters 134, 138 can measure.

Figure 6A:
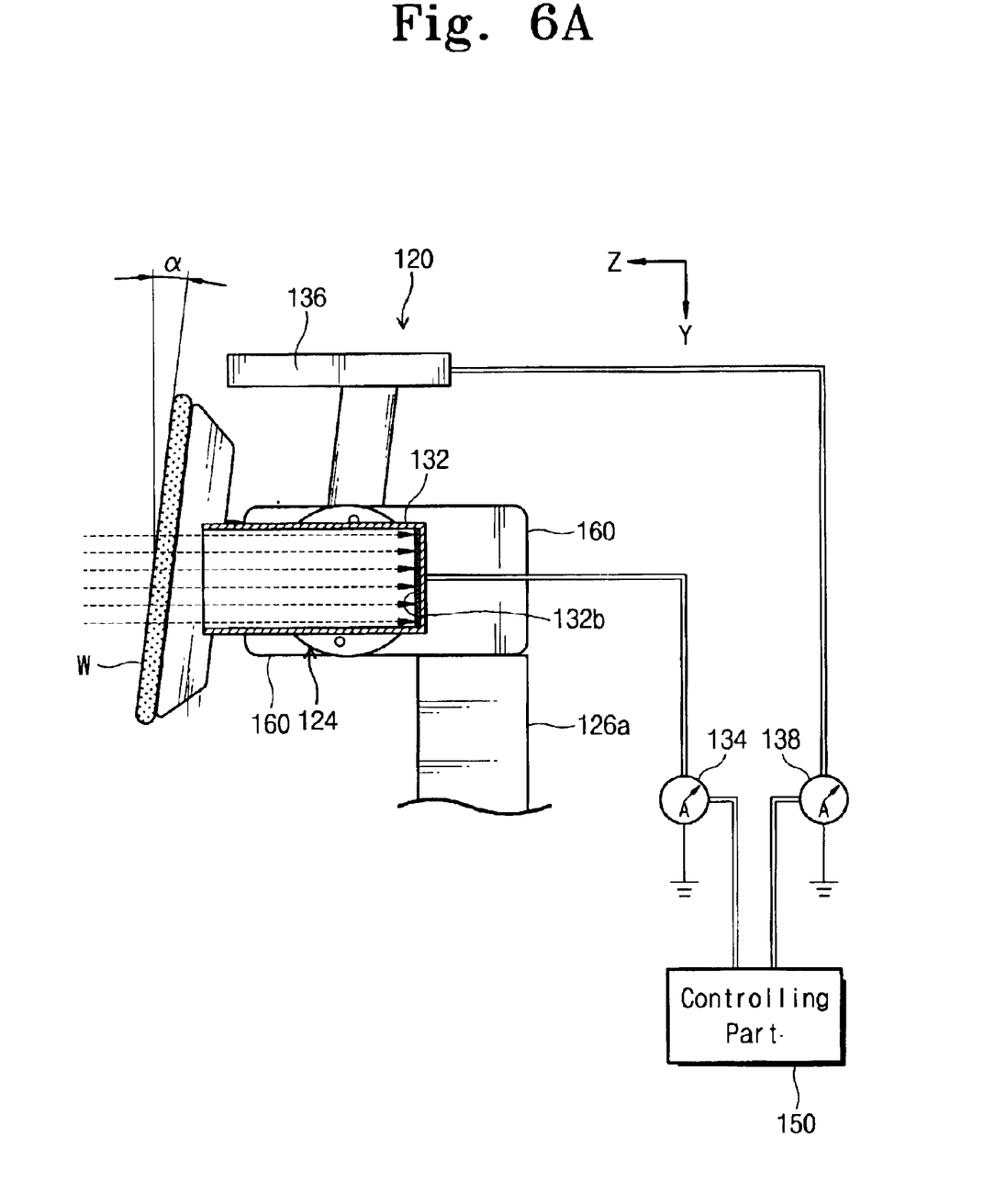
FIGS. 6A and 6B illustrate the ESC rotated by a target tilt angle and the ESC not rotated by the target tilt angle, respectively.
Figure 6B:
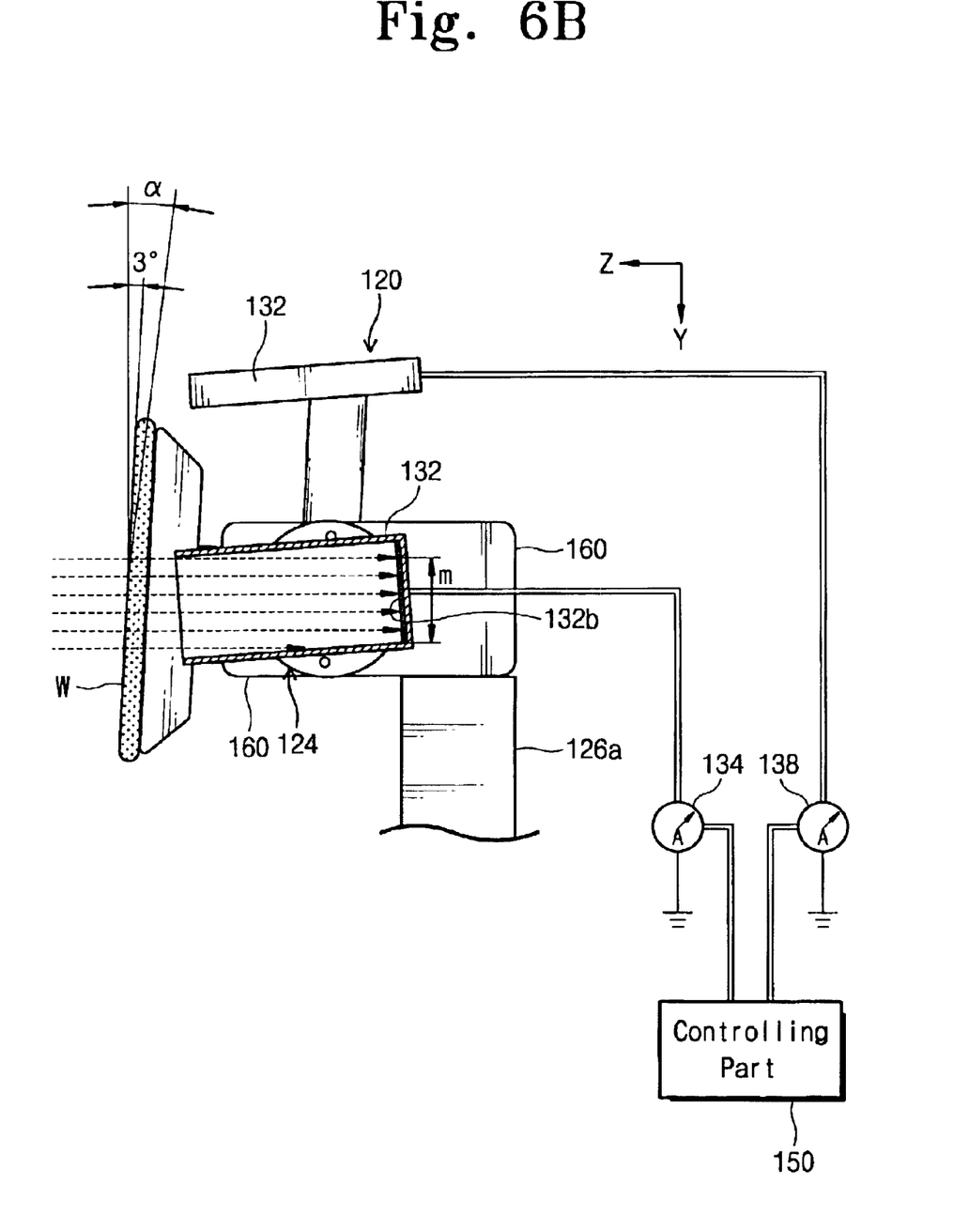

FIGS. 6A and 6B illustrate the ESC rotated by the target tilt angle and the ESC not rotated by the target tilt angle, respectively.

As illustrated in FIG. 6A, when the ESC 122 is rotated to the target tilt angle with respect to the x-axis, the ion beam e can be projected against the entire surface of the conductive plate 132b of the first faraday cup 132. However, as illustrated in FIG. 6B, when the ESC 122 is not rotated to the proper target tilt angle a with respect to the x-axis, the ion beam e is projected against only a portion "m" of the conductive plate 132b of the first faraday cup 132. Accordingly, in the case such as that illustrated in FIG. 6A, the accumulated current values measured by the meter 134 are the same as the pre-set current values, whereas, in case of FIG. 6B, the accumulated current values measured by the meter 134 are less than the pre-set current values.

As a result, the controlling part 150 can check whether the ESC 122 is rotated from the target tilt angle with respect to the x-axis, and, if so, can control the first rotating part 124 so as to compensate the tilt angle. Likewise, the controlling part 150 can compare the accumulated current value measured by the second meter 138 with the pre-set current value and determine whether the ESC 122 is rotated by the target tilt angle with respect to the y-axis.

Figure 7:
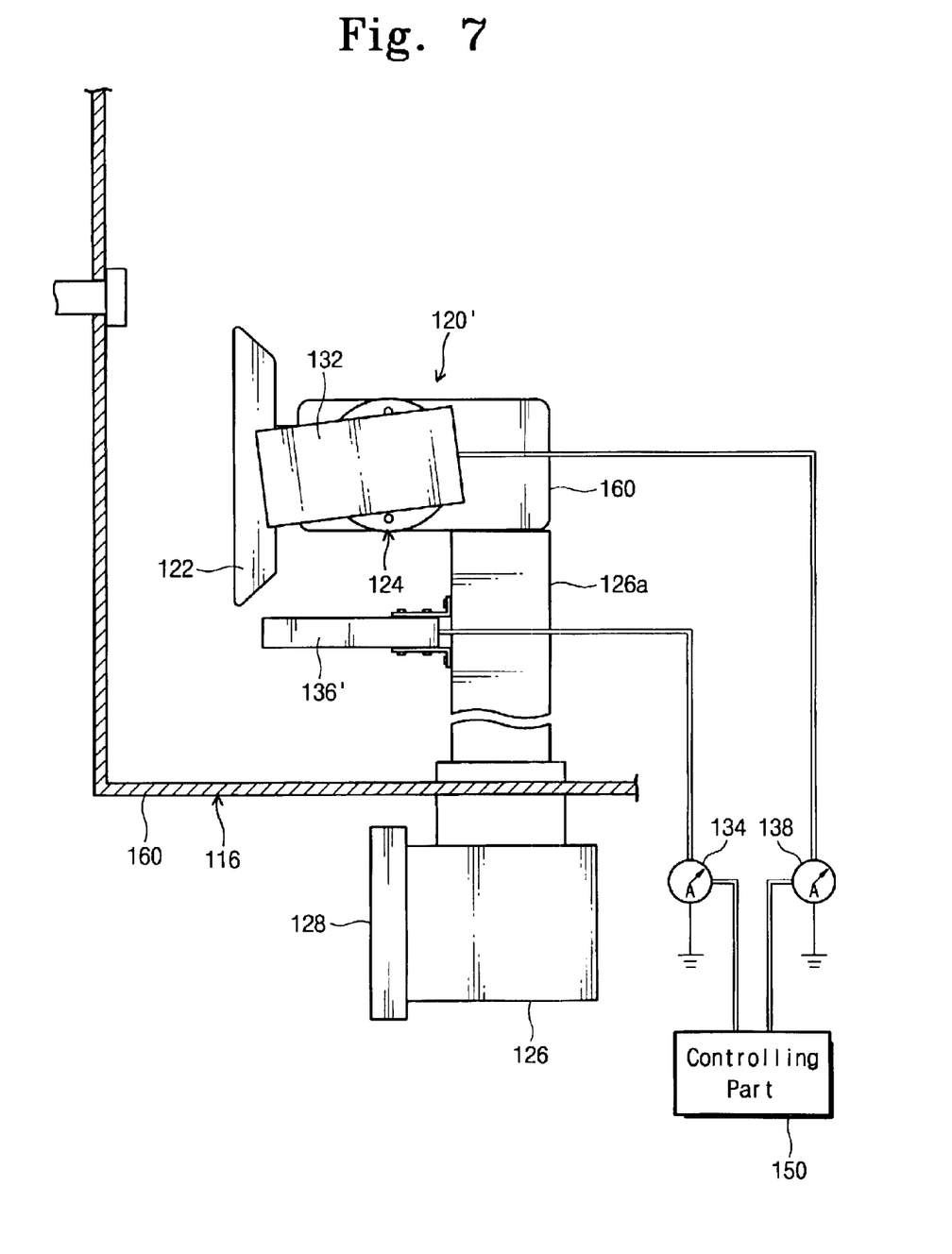
FIG. 7 illustrates a transformed example according to embodiments of the invention.

FIG. 7 illustrates another embodiment of the present invention. The wafer holding apparatus 120' as illustrated in FIG. 7 includes an ESC 122; a first rotating part 124; a second rotating part 126; a lift member 128; an angle measuring system; and a controlling part 150, whose constructions and functions are the same as those described above. In the embodiment shown in FIG. 7, however, the second faraday cup 136' of the angle measuring means is mounted on a shaft 126a of the second rotating part 126, and not on the first rotating part 124. The second faraday cup 136' is used to measure the rotation angle of a main surface of the wafer with respect to y-axis. The second faraday cup 136' need not to be tilted by an incidence angle of an ion beam as in the case when it is mounted on the first rotating part 124. The second faraday cup 136' is preferably mounted on the shaft 126a of the second rotating part 126 in parallel with the ion beam.

While the present invention has been described in connection with specific and preferred embodiments thereof, it is capable of various changes and modifications without departing from the spirit and scope of the invention. For example, a person skilled in the art will appreciate that the ESC or the rotating part can be changed depending on applications. It should be appreciated that the scope of the invention is not limited to the detailed description of the invention hereinabove, which is intended merely to be illustrative, but rather comprehends the subject matter defined by the following claims.

As explained so far, the ion implanting system described above can monitor the incidence angle of the ion beam with respect to the tilted wafer in real-time. In addition, the ion implanting system of the present invention can sense the tilt angle of the ion beam with respect to the main surface of the wafer mounted on the ESC. As a result, it is capable of preventing deterioration caused by the deviation of the tilt angle.

According to an aspect of the present invention, the ion implanting system includes an x-axis rotating part; a y-axis rotating part; a first angle measuring system; a second angle measuring system; and a controller. The x-axis rotating part rotates the main surface of the wafer on an x-axis, and the y-axis rotating part rotates the main surface of the wafer on a y-axis. The first angle measuring system is rotated along with the main surface of the wafer and measures a tilt angle of the main surface of the wafer with respect to the x-axis. The second angle measuring system is rotated along with the main surface of the wafer and measures a tilt angle of the main surface of the wafer with respect to the y-axis. The controller, when the measured tilt angles are different from target tilt angles, controls the x- and y-axis rotating parts so that the target tilt angles can be the same as the measured tilt angles.

The first angle measuring system of the present invention may include a first faraday cup and a first meter. The first faraday cup has a slot and a beam sensing region corresponding to the slot, and is fixed to and mounted on the x-axis rotating part. The first meter measures the amount of current provided to the beam sensing region so as to control and neutralize secondary electrons generated by collision of the ion beam with the ion beam region of the first faraday cup. The first faraday cup may be mounted to be tilted on the x-axis by an incidence angle of the ion beam against the main surface of the wafer with respect to the y-axis. When the main surface of the wafer is rotated by the target tilt angle, the beam sensing region of the first faraday cup may be perpendicular to the ion beam.

The controller, when the ion beam is projected perpendicularly against an entire surface of the beam sensing region of the first faraday cup, adjusts the current measured by the first meter to the target tilt angle of the x-axis so as to control the x-axis rotating part.

The second angle measuring system may include a second faraday cup and a second meter. The second faraday cup has a slot and a beam sensing region corresponding to the slot. The second meter measures the amount of current provided to the beam sensing region so as to control and neutralize secondary electrons generated by collision of the ion beam with the ion beam region of the second faraday cup.

The second Faraday cup is fixed to and mounted on either the y-axis rotating part or the x-axis rotating part. In addition, the beam sensing region of the second faraday cup may be parallel with the main surface of the wafer on the x-axis.

The controller, when the ion beam is projected perpendicularly against an entire surface of the beam sensing region of the second faraday cup, adjusts the current measured by the second meter to the target tilt angle of the y-axis so as to control the y-axis rotating part.

According to another feature of the present invention, the wafer holding apparatus for the ion implanting system includes a holding member for fixing a wafer; an x-axis rotating part for rotating the holding member on an x-axis with respect to an incidence direction of an ion beam; and a y-axis rotating part for rotating the holding member on a y-axis with respect to an incidence direction of the ion beam. The wafer holding apparatus for the ion implanting system further includes a measuring system and a controller. The measuring system is moved along with the holding member by the x- and y-axis rotating parts and measures the ion beam. The controller compares and operates the measured data with pre-set data and, according to the result, compensates a tilt angle of the holding member.

The measuring system can include first and second faraday cups. The first faraday cup has a slot as well as a conductive plate against which the ion beam is projected through the slot, and is fixed to and mounted on the x-axis rotating part. The second faraday cup has a slot as well as a conductive plate against which the ion beam is projected through the slot, and is fixed to and mounted on the x-axis rotating part. The measuring system further includes first and second meters. The first meter measures the amount of current provided to the conductive plate so as to control and neutralize secondary electrons generated by collision of the ion beam with the conductive plate of the first faraday cup. The second meter measures the amount of current provided to the conductive plate so as to control and neutralize secondary electrons generated by collision of the ion beam with the conductive plate of the second faraday cup.

The controller, when the ion beam is projected perpendicularly against the conductive plate of the first faraday cup, may control the x-axis rotating part such that a current value (a pre-set value) measured by the first meter reaches a reference value. Likewise, the controlling part, when the ion beam is projected perpendicularly against the conductive plate of the second faraday cup, may control the y-axis rotating part such that a current value (a pre-set value) measured by the second meter reaches a reference value.

During the ion implantation into the wafer, the controller may compare accumulated current values obtained by accumulating the current values measured by the first and second meters as data. The first and second faraday cups may be mounted on the first and second rotating parts in parallel with the ion beam when the wafer holding apparatus is rotated by the target tilt angle. In some embodiments of the present invention, when the wafer holding apparatus is rotated by the target tilt angle, the ion beam may be projected perpendicularly against the conductive plates of the first and second faraday cups.

The first faraday cup may be tilted on the y-axis by an incidence angle of a main surface of the wafer fixed to the wafer holding apparatus with respect to the x-axis.

What is claimed is:

1. An ion implanting system comprising:
   an x-axis rotating part for rotating a main surface of a wafer holder about an x-axis;
   a y-axis rotating part for rotating the main surface of the wafer holder about a y-axis;
   a first angle measuring device structured to be moved along with the main surface of the wafer holder, the first angle measuring device for measuring a tilt angle with respect to the x-axis of the main surface of the wafer holder, the first angle measuring device comprising:
      a first faraday cup having a slot and a beam sensing region corresponding to the slot, the first faraday cup mounted on the x-axis rotating part at an angle that is offset by an amount equal to a target tilt angle, from a line perpendicular to the main surface of the wafer,
      a first meter for measuring an amount of current provided to the beam sensing region, the current in the beam sensing region for controlling and neutralizing secondary electrons generated by collisions of an ion beam with the beam sensing region of first faraday cup;
   a second angle measuring device structured to be moved along with the main surface of the wafer holder, the second angle measuring device for measuring a rotation angle with respect to the y-axis of the main surface of the wafer holder; and
   a controller coupled to the first angle measuring device and the second angle measuring device, the controller structured to, when the measured tilt and measured rotation angles are different from the target tilt angle and a target rotation angle, control the x- and y-axis rotating parts until the measured tilt and measured rotation angles are equal to the target tilt and target rotation angles.

2. The system as claimed in claim 1 wherein the beam sensing region of the first faraday cup is perpendicular to the ion beam when the main surface of the wafer holder is tilted to the target tilt angle.

3. The system as claimed in claim 1, wherein the controller, when the ion beam is projected perpendicularly against an entire surface of the beam sensing region of the first faraday cup, is structured to control the x-axis rotating part based on the current measured by the first meter.

4. The system as claimed in claim 1, wherein the second angle measuring device comprises:
   a second faraday cup having a slot and a beam sensing region corresponding to the slot; and
   a second meter for measuring an amount of current provided to the beam sensing region of the second faraday cup, the current in the beam sensing region for controlling and neutralizing secondary electrons generated by collisions of an ion beam with the beam sensing region of the second faraday cup.

5. The system as claimed in claim 4, wherein the second faraday cup is fixedly mounted to either the y-axis rotating part or the x-axis rotating part.

6. The system as claimed in claim 4, wherein the beam sensing region of the second faraday cup is perpendicular to the ion beam when the main surface of the wafer is tilted to the target tilt angle.

7. The system as claimed in claim 4, wherein the beam sensing region of the second faraday cup is parallel to the main surface of the wafer holder on the x-axis.

8. The system as claimed in claim 4, wherein the controller, when the ion beam is projected perpendicularly against the entire surface of the beam sensing region of the second faraday cup, is structured to control the y-axis rotating part based on the current measured by the second meter.

9. The system as claimed in claim 1, wherein a wafer is affixed to the wafer holder.

10. The system as claimed in claim 9, wherein the wafer holder is fixed to the x-axis rotating part.

11. A wafer holding apparatus for an ion implanting system comprising:
    a holding member to which a wafer can be affixed;
    an x-axis rotating part for tilting the holding member on an x-axis with respect to an incidence direction of an ion beam;
    a y-axis rotating part for rotating the holding member on a y-axis with respect to the incidence direction of the ion beam;
    a measuring system for measuring the ion beam and mounted so as to be moved along with the holding member by the x- and y-axis rotating parts, the measuring system comprising:
        a first faraday cup having a slot and a conductive plate against which the ion beam can be projected through the slot, the first faraday cup fixed to and mounted on the x-axis rotating part, wherein when a main surface of the wafer is tilted from the ion beam by an incidence angle α, the conductive plate in the first faraday cup is perpendicular to the ion beam,
        a second faraday cup having a slot and a conductive plate against which the ion beam can be projected through the slot, the second faraday cup fixed to and mounted on the y-axis rotating part,
        a first meter for measuring an amount of current provided to the conductive plate of the first faraday cup, the current in the conductive plate for controlling and neutralizing secondary electrons generated by collisions of an ion beam with the conductive plate of the first faraday cup, and
        a second meter for measuring an amount of current provided to the conductive plate of the second faraday cup, the current in the conductive plate for controlling and neutralizing secondary electrons generated by collisions of the ion beam with the conductive plate of the second faraday cup; and
    a controller for comparing data measured by the measuring system to pre-set data and, according to the result of the comparison, compensating a position of the holding member relative to the ion beam.

12. The apparatus as claimed in claim 11, wherein the controller, when the ion beam is projected perpendicularly against the conductive plate of the first faraday cup, is structured to control the x-axis rotating part such that a current value measured by the first meter reaches a first reference value.

13. The apparatus as claimed in claim 12, wherein the controller, when the ion beam is projected perpendicularly against the conductive plate of the second faraday cup, is structured to control the y-axis rotating part such that a current value measured by the second meter reaches a second reference value.

14. The apparatus as claimed in claim 11, wherein the controller, during an ion implantation into the wafer, compares accumulated current values, obtained by accumulating the current values measured by the first and second meters, to pre-set data.

15. The apparatus as claimed in claim 11, wherein the first and second faraday cups are respectively mounted on the x-axis and y-axis rotating parts so as to be parallel to the ion beam when the wafer holding apparatus is at a desired position relative to the ion beam.

16. The apparatus as claimed in claim 15, wherein, when the wafer holding apparatus is positioned to the desired position, the ion beam is projected perpendicularly against the conductive plates of the first and second faraday cups.

17. The apparatus as claimed in claim 11, wherein the second faraday cup is parallel on the y-axis to a main surface of the wafer fixed to the wafer holding apparatus.

18. The apparatus as claimed in claim 11, wherein the first faraday cup is mounted at a predetermined angle with respect to the x-axis.

19. The apparatus as claimed in claim 18, wherein the first faraday cup is tilted on the x-axis by an angle equal to an incidence angle α of the ion beam against the main surface of the wafer.

20. The apparatus as claimed in claim 19, wherein the first faraday cup is tilted by between about 2 to 8 degrees.

21. An ion implantation system, comprising:
    a wafer holder having a wafer holding surface structured to hold a wafer in an ion beam, the wafer holder tiltable on an x-axis and rotatable on a y-axis relative to the ion beam;
    a measuring system mounted to the wafer holder and structured to measure a number of ions striking a beam sensor and to generate a measuring signal; and
    a feedback controller coupled to the measuring system and structured to tilt and rotate the wafer holder based on the measuring signal.

22. An ion implantation system, comprising:
    a wafer holder having a wafer holding surface structured to hold a wafer in an ion beam, the wafer holder tiltable on an x-axis and rotatable on a y-axis relative to the ion beam, wherein, when the wafer holder is in a target position, the wafer holding surface is tilted from a line perpendicular to the ion beam by an incidence angle α;
    a faraday cup having an opening and structured to measure a number of ions striking a beam sensor that is mounted in the faraday cup perpendicular to the opening and to generate a measuring signal, wherein the faraday cup is mounted such that, when the wafer holding surface of the wafer holder is tilted, the faraday cup is also tilted; and
    a feedback controller coupled to the beam sensor and structured to tilt and rotate the wafer holder based on the measuring signal.

23. The ion implantation system of claim 22, wherein, when the wafer holder is in the target position, the beam sensor is perpendicular to the ion beam.

24. The ion implantation system of claim 22, further comprising a second faraday cup.

25. The ion implantation system of claim 22, wherein, when the wafer holder is rotated, the second faraday cup is also rotated.

26. A method for performing an ion implantation into a wafer held by a wafer holder that is tiltable and rotatable, the method comprising;
    generating ions and directing them toward the wafer holder;

measuring an amount of ions falling on a first beam sensor that is mounted to the wafer holder, wherein the first beam sensor is mounted such that, when the wafer holding surface of the wafer holder is tilted, the first beam sensor is also tilted, and when the wafer holder is in a target position, the wafer holding surface is tilted from a line perpendicular to the ion beam by an incidence angle $\alpha$; and moving the wafer holder based on the measured amount of ions.

27. The method of claim 26 wherein moving the wafer holder comprises tilting, rotating, or both tilting and rotating.

28. The method of claim 26, further comprising comparing the measured amount of ions to a pre-stored value.

29. The method of claim 28 wherein the pre-stored value indicates a maximum amount of ions falling on the first beam sensor.

30. The method of claim 26, wherein moving the wafer holder also comprises moving the first beam sensor.

31. The method of claim 30, further comprising, moving a second beam sensor.

32. The method of claim 31, wherein the first beam sensor is mounted to a first axis mover, and wherein the second beam sensor is mounted to a second axis mover.

33. The method of claim 32, wherein the wafer holder is coupled to the first axis mover and the second axis mover.

34. An ion implanting system comprising:
   an x-axis rotating part for rotating a main surface of a wafer holder about an x-axis,
   a y-axis rotating part for rotating the main surface of the wafer holder about a y-axis;
   a first faraday cup having a slot and a beam sensing region corresponding to the slot, the first faraday cup fixed to and mounted on the x-axis rotating part at an angle that is offset by an amount equal to a target tilt angle, from a line perpendicular to the main surface of the wafer, the first faraday cup for measuring a tilt angle with respect to the x-axis of the main surface of the wafer holder;
   a first meter for measuring an amount of current provided to the beam sensing region, the current in the beam sensing region for controlling and neutralizing secondary electrons generated by collisions of an ion beam with the beam sensing region of the first faraday cup;
   a second angle measuring device structured to be moved along with the main surface of the wafer holder, the second angle measuring device for measuring a rotation angle with respect to the y-axis of the main surface of the wafer holder; and
   a controller coupled to the first meter and the second angle measuring device, the controller structured to, when the measured tilt and measured rotation angles are different from target tilt and target rotation angles, controlling the x- and y-axis rotating parts until the measured tilt and measured rotation angles are equal to the target tilt and target rotation angles.

35. The ion implanting system of claim 34, wherein the beam sensing region of the first faraday cup is perpendicular to the ion beam when the main surface of the water holder is tilted to the target tilt angle.

36. A wafer holding apparatus for an ion implanting system comprising:
   a holding member to which a wafer can be affixed;
   an x-axis rotating part for tilting the holding member on an x-axis with respect to an incidence direction of an ion beam;
   a y-axis rotating part for rotating the holding member on a y-axis with respect to the incidence direction of the ion beam;
   a first faraday cup having a slot and a conductive plate against which the ion beam can be projected through the slot, the first faraday cup fixed to and mounted on the x-axis rotating part, the conductive plate in the first faraday cup is perpendicular to the ion beam when a main surface of the wafer is tilted from the ion beam by an incidence angle $\alpha$;
   a second faraday cup having a slot and a conductive plate against which the ion beam can be projected through the slot, the second faraday cup fixed to and mounted on the y-axis rotating part;
   a first meter for measuring an amount of current provided to the conductive plate of the first faraday cup, the current provided to the conductive plate for controlling and neutralizing secondary electrons generated by collisions of an ion beam with the conductive plate of the first faraday cup;
   a second meter for measuring an amount current provided to the conductive plate of the second faraday cup, the current provided to the conductive plate for controlling and neutralizing secondary electrons generated by collisions of the ion beam with the conductive plate of the second faraday cup; and
   a controller for comparing data measured by the first meter and the second meter to pre-set data and, according to the result of the comparison, compensating a position of the holding member relative to the ion beam.

37. The apparatus as claimed in claim 36 wherein the incidence angle $\alpha$ is between about 2 to 8 degrees.

38. An ion implantation system, comprising:
   a wafer holder having a wafer holding surface structured to hold a wafer in an ion beam, the wafer holder tiltable on an x-axis and rotatable on a y-axis relative to the ion beam, the wafer holding surface tilted from a line perpendicular to the ion beam by an incidence angle $\alpha$ when the wafer holder is in a target position;
   a faraday cup having an opening and structured to measure a number of ions striking a beam sensor that is mounted in the faraday cup perpendicular to the opening and to generate a measuring signal, the faraday cup mounted such that, when the wafer holding surface of the wafer holder is tilted, the faraday cup is also tilted; and
   a feedback controller coupled to the measuring system and structured to tilt and rotate the wafer holder based on the measuring signal.

* * * * *

UNITED STATES PATENT AND TRADEMARK OFFICE
CERTIFICATE OF CORRECTION

PATENT NO. : 6,903,348 B2  Page 1 of 1
APPLICATION NO. : 10/302664
DATED : June 7, 2005
INVENTOR(S) : Jang et al.

It is certified that error appears in the above-identified patent and that said Letters Patent is hereby corrected as shown below:

At column 4, line 64, replace "($\alpha$," with --($\alpha$;--

At column 8, line 28, replace "of first" with --of the first--

At column 10, line 59, replace "further comprising a second faraday cup" with --further a second faraday cup--

At column 11, line 31, replace "x-axis," with --x-axis;--

At column 11, line 59, replace "claim 34," with --claim 34--

At column 12, line 30, replace "amount current" with --amount of current--

Signed and Sealed this

Twenty-sixth Day of December, 2006

JON W. DUDAS
*Director of the United States Patent and Trademark Office*